Oct. 16, 1956 F. W. WARNER 2,767,316

OSCILLATOR

Filed Nov. 17, 1954

INVENTOR.
FRANK W. WARNER
BY F. A. Rechif
AGENT 2,767,316

OSCILLATOR

Frank W. Warner, Baton Rouge, La., assignor to Radio Corporation of America, a corporation of Delaware Application November 17, 1954, Serial No. 469,370

9 Claims. (Cl. 250—36)

This invention relates to an oscillator, such as might be used for example as a so-called "burst oscillator" in color television receivers. Such an oscillator is continuously operating, but is locked in periodically by bursts of oscillatory energy received from a remote transmitter, hence the name "burst oscillator." However, the oscillator can be used in other environments or systems requiring a locked oscillator, that is, an oscillator that is to be synchronizeed with another oscillator.

An object of this invention is to devise a novel type of continuously-operating crystal oscillator, one in which a rather large variation of the oscillator frequency may be effected in response to a control voltage, even though the oscillator is crystal-stabilized and is therefore inherently quite stable.

Another object is to devise an improved crystal oscillator which provides a substantially constant output amplitude over a quite large variation of oscillatory output frequency.

A further object is to accomplish the above objects in an efficient manner, using only standard, commercially-available components.

The objects of this invention are accomplished, briefly, in the following manner: A piezoelectric crystal is connected into the cathode circuit of a vacuum tube to provide a low impedance between the cathode and ground only at the series-resoniant frequency of the crystal. When the cathode of the tube is thus grounded, the tube operates as a tuned-anode feedback oscillator in which part of the capacitance of the tuned anode circuit is provided by the effective input capacitance of the tube. Variations of the transconductance of the tube, by changing the bias applied to a grid thereof, causes the tube input capacitance to vary, thus varying the tuning of the tuned anode circuit and consequently also the oscillator frequency.

Figure 1:
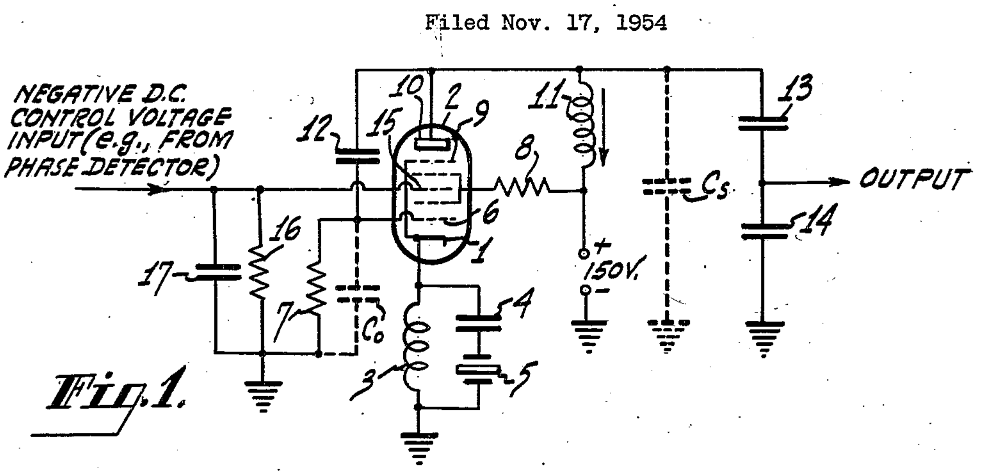
Figure 2:
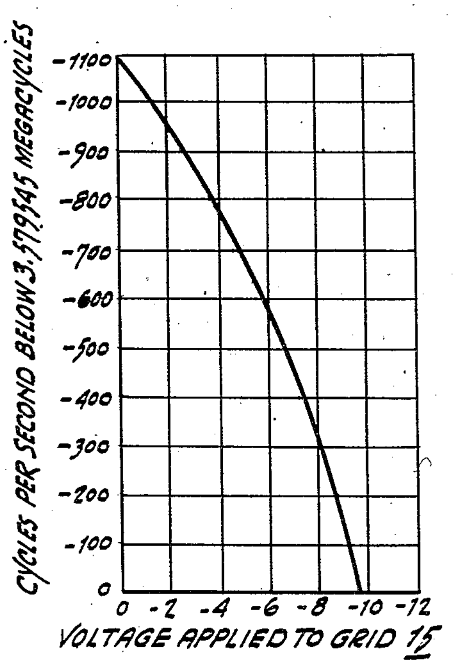
Figure 3:
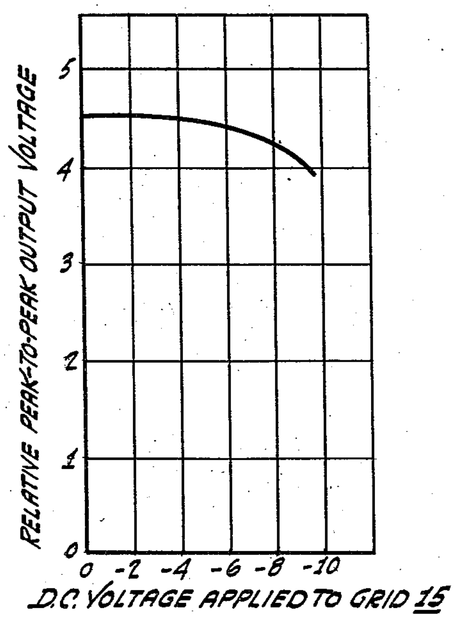

The foregoing as well as other objects of the invention will be best understood from the following description of an exemplification thereof, reference being had to the accompanying drawing, wherein:

Fig. 1 is a schematic circuit diagram of an oscillator according to this invention; and Figs. 2 and 3 are graph curves illustrating test results obtained with the invention.

Referring now to Fig. 1, the cathode 1 of a vacuum tube 2, for example of the 6BE6 pentagrid converter type, is connected to ground through an inductance 3 which is capable of passing the direct current flowing in the anode-cathode circuit of the tube. Across inductance 3 there is connected a series combination consisting of a capacitor 4 and a piezoelectric crystal 5, so that this combination is also connected between the cathode 1 and ground.

The first grid 6 of tube 2 is connected to a point of fixed reference potential such as ground through a resistor 7. During operation, grid current flowing through resistor 7 provides self-bias for tube 2. The effective input capacitance $C_o$ of the tube 2, generally considered to be the capacitance between the first grid 6 and ground, is illustrated in dotted lines.

The second and fourth grids of tube 2 are connected together and connected through a resistor 8 to the positive terminal of a source of unidirectional potential, indicated by +150 v., while the fifth grid 9 is connected to the cathode 1. The negative terminal of this source of unidirectional potential is connected to ground.

The anode 10 of tube 2 is connected through a suitable tunable (or adjustable) inductance 11 to the positive terminal +150 v. For feedback purposes, the anode 10 is coupled through a small capacitor 12 to grid 6. Output from the tube 2 is taken from the anode 10 thereof by means of a capacitive voltage divider consisting of two capacitors 13 and 14 connected in series between anode 10 and ground, the output connection being at the common junction of the two capacitors.

The capacitor $C_s$, illustrated in dotted lines, is the capacitance which is connected in parallel with inductance 11, from the anode end of inductance 11 to ground, the end of inductance 11 remote from anode 10 being connected to ground through a bypass capacitor (not shown). It may be seen that the capacitance $C_s$ is made up of the following capacitances: component 12 and $C_o$ in series, stray capacitance in inductance 11, the output capacitance of tube 2, and the series combination of elements 13 and 14. The aforementioned elements and combinations of elements can be considered to be effectively in parallel across inductance 11, in obvious circuits.

For a purpose that will appear hereinafter, a negative D. C. control voltage derived from a suitable source may be applied to the third grid 15 of tube 3, this voltage varying for example from zero to about −9 volts for control purposes. A resistor 16 and a capacitor 17 are connected in parallel from grid 15 to ground.

The circuit 11, $C_s$ is tuned to a frequency approximately 1000 c. p. s. below the series-resonant frequency of crystal 5, with zero control voltage applied to grid 15. The capacitor 4 enables some adjustment of the series resonant frequency of the combination 4, 5 to be made. For an oscillator designed to operate at 3.579545 mc., for example, the series-resonant frequency of the crystal 5 might be 3.580045 mc.; in this case, the circuit 11, $C_s$ would be tuned to 3.579045 mc., with zero control voltage on grid 15.

Without the crystal 5 in the circuit or at frequencies considerably different from the series-resonant frequency of the crystal, there is a high impedance from cathode 1 to ground. This means that the tube 2 acts similar to a phase splitter or phase inverter under these particular conditions, having substantial impedances connected to both its anode and its cathode. Any feedback from anode 10 through capacitor 12 to grid 6 then tends to be degenerative and the tube will not tend to oscillate. Even if it does oscillate, however, it will do so at some frequency considerably away from the desired frequency. Also, if the crystal is not present the amplitude of any oscillation produced is only about one-fourth of that with the crystal present.

With the crystal 5 present in the cathode circuit, it offers a very low impedance from the cathode 1 to ground at its series-resonant frequency and also at a frequency ±1000 C. P. S. from its resonant point. Then, since the cathode 1 is grounded through a low effective series resistance of approximately 42 ohms, for example, and since the anode circuit 11, $C_s$ is tuned to a frequency approximately 1000 C. P. S. below the crystal series-resonant frequency, regenerative feedback takes place through capacitor 12 and oscillations are developed, the circuit then operating as an anode-tuned feedback oscillator at a frequency that is stabilized by means of crystal 5. However, this frequency may be varied over a certain range, as will hereinafter appear.

A phase detector of any suitable type (not shown)

compares the oscillator output frequency to a standard (the latter, for example, may be derived from a "burst" transmitted by a color television transmitter) and produces a negative D. C. voltage proportional to the difference between the two compared frequencies. This negative D. C. voltage is applied to grid 15 and, as it changes, causes the transconductance of the tube 2 to change correspondingly. If the transconductance of an anode-loaded amplifier (such as tube 2 when in normal operation) is changed, its input susceptance changes. This means that the change in transconductance caused by a change in the negative voltage applied to grid 15 causes the effective input capacitance, $C_o$, to change. This change in $C_o$ changes the resonant frequency of the tuned circuit 11, $C_s$, since $C_s$ includes 12 and $C_o$ in series. In other words, the anode-tuned oscillator disclosed in effect has a variable capacitor $C_s$ across its tuned anode circuit, so that the resonant frequency of this tuned circuit and the output frequency of the oscillator change in response to changes in the control voltage applied to grid 15.

Fig. 2 is a graph curve showing actual test results obtained with an oscillator constructed according to this invention. This curve shows the actual change in the oscillator output frequency with a change in the control voltage applied to grid 15 of tube 2. From this curve, it may be seen that a frequency variation of about 1100 C. P. S. can be produced by not much more than a range of zero to about −9 volts on grid 15.

Even though the oscillator output frequency varies as much as 1100 C. P. S. for a certain range of control voltage applied to grid 15, the circuit of this invention provides a nearly constant output over this frequency range. This nearly constant output comes about by reason of the following. When grid 15 is made more negative (by an increase in the negative control voltage applied thereto), this tends to reduce the oscillatory output amplitude. As this amplitude is reduced the grid current flowing through resistor 7 in the circuit of grid 6 is reduced, decreasing the self-bias provided by this resistor and thus tending to increase the oscillatory output amplitude. In this way, good stabilization of the output amplitude is provided. Conversely, when grid 15 is made less negative by a change in the control voltage applied thereto, the oscillatory output amplitude tends to increase. The grid current flowing through resistor 7 then increases, increasing the self-bias and tending to decrease the oscillatory output amplitude.

Fig. 3 is a graph curve showing actual test results in this regard. This curve shows the relation between the oscillatory output voltage and the D. C. voltage applied to grid 15. From this curve, it may be seen that nearly constant output is provided over the range of zero to about −9 volts on grid 15.

The following are typical component values used in a circuit built according to this invention and successfully tested. These values are given by way of example only.

| | | |
|---|---|---|
| Resistor **7** | ohms | 2800 |
| Resistor **8** | do | 10K |
| Resistor **16** | do | 22K |
| Capacitor **4** | mmfd | 100 |
| Capacitor **12** | mmfd | 5 |
| Capicitor **13** | mmfd | 62 |
| Capacitor **14** | mmfd | 5 |
| Capacitor **17** | mfd | 0.001 |
| Inductor **3** | microhenries | 740 |
| Inductor **11** | do | 58 |

What is claimed is:

1. An oscillator comprising an electron discharge device having at least an anode electrode, a cathode electrode, and a grid electrode, means coupling said cathode electrode to a point of fixed reference potential through a path of low impedance, an inductor coupling said anode electrode to the positive terminal of a unidirectional potential source, a capacitor coupling said anode electrode to said grid electrode to provide feedback from said anode electrode to said grid electrode, said capacitor and the input capacitance of said device constituting a series circuit connected across said inductor to resonate the same and to thereby cause said device to act as an anode-tuned feedback oscillator, and means for varying said input capacitance to vary the frequency of said oscillator.

2. An oscillator comprising an electron discharge device having at least anode, cathode and first and second grid electrodes, means coupling said cathode electrode to a point of fixed reference potential through a path of low impedance, output connections coupled to said anode electrode, an inductor coupling said anode electrode to the positive terminal of a unidirectional potential source, a capacitor coupling said anode electrode to said first grid electrode to provide feedback from said anode electrode to said first grid electrode, said capacitor and the input capacitance of said device constituting a series circuit connected across said inductor to resonate the same and to thereby cause said device to act as an anode-tuned feedback oscillator, and means for applying a variable voltage to said second grid electrode to vary said input capacitance.

3. An oscillator comprising an electron discharge device having at least an anode electrode, a cathode electrode, and a grid electrode, a piezoelectric crystal connected between said cathode electrode and a point of fixed reference potential to provide a path of low impedance therebetween at substantially the crystal resonant frequency, an inductor coupling said anode electrode to the positive terminal of a unidirectional potential source, a capacitor coupling said anode electrode to said grid electrode to provide feedback from said anode electrode to said grid electrode, said capacitor and the input capacitance of said device constituting a series circuit connected across said inductor to resonate the same and to thereby cause said device to act as an anode-tuned feedback oscillator, and means for varying said input capacitance to vary the frequency of said oscillator.

4. An oscillator comprising an electron discharge device having at least an anode electrode, a cathode electrode, and a grid electrode, means coupling said cathode electrode to a point of fixed reference potential through a path of low impedance, an inductor coupling said anode electrode to the positive terminal of a unidirectional potential source, a capacitor coupling said anode electrode to said grid electrode to provide feedback from said anode electrode to said grid electrode, said capacitor and the input capacitance of said device constituting a series circuit connected across said inductor to resonate the same and to thereby cause said device to act as an anode-tuned feedback oscillator, and means for varying the transconductance of said device in accordance with a control potential, to thereby vary said input capacitance.

5. For use in a color television receiver, an oscillator comprising an electron discharge device having at least an anode electrode, a cathode electrode, and two grid electrodes, means coupling said cathode electrode to a point of fixed reference potential through a path of low impedance, an inductor coupling said anode electrode to the positive terminal of a unidirectional potential source, a capacitor coupling said anode electrode to one of said grid electrodes to provide feedback from said anode electrode to said one grid electrode, said capacitor and the input capacitance of said device constituting a series circuit connected across said inductor to resonate the same and to thereby cause said device to act as an anode-tuned feedback oscillator, and means for varying the transconductance of said device in accordance with a control potential, to thereby vary said input capacitance, said last-mentioned means comprising connections for applying a unidirectional control voltage to the other of said grid electrodes.

6. An oscillator comprising an electron discharge device having at least an anode electrode, a cathode electrode, and a grid electrode, a piezoelectric crystal connected between said cathode electrode and a point of fixed reference potential to provide a path of low impedance therebetween at substantially the crystal resonant frequency, an inductor coupling said anode electrode to the positive terminal of a unidirectional potential source, a capacitor coupling said anode electrode to said grid electrode to provide feedback from said anode electrode to said grid electrode, said capacitor and the input capacitance of said device constituting a series circuit connected across said inductor to resonate the same and to thereby cause said device to act as an anode-tuned feedback oscillator, and means for varying the transconductance of said device in accordance with a control potential, to thereby vary said input capacitance.

7. An oscillator comprising an electron discharge device having at least an anode electrode, a cathode electrode, and two grid electrodes, a piezoelectric crystal connected between said cathode electrode and a point of fixed reference potential to provide a path of low impedance therebetween at substantially the crystal resonant frequency, an inductor coupling said anode electrode to the positive terminal of a unidirectional potential source, a capacitor coupling said anode electrode to one of said grid electrodes to provide feedback from said anode electrode to said one grid electrode, said capacitor and the input capacitance of said device constituting a series circuit connected across said inductor to resonate the same and to thereby cause said device to act as an anode-tuned feedback oscillator, and means for varying the transconductance of said device in accordance with a control potential, to thereby vary said input capacitance, said last-mentioned means comprising connections for applying a unidirectional voltage to the other of said grid electrodes.

8. An oscillator comprising an electron discharge device having at least anode, cathode and first and second grid electrodes, a piezoelectric crystal connected between said cathode electrode and a point of fixed reference potential to provide a path of low impedance therebetween at substantially the crystal resonant frequency, output connections coupled to said anode electrode, an inductor coupling said anode electrode to the positive terminal of a unidirectional potential source, a capacitor coupling said anode electrode to said first grid electrode to provide feedback from said anode electrode to said first grid electrode, said capacitor and the input capacitance of said device constituting a series circuit connected across said inductor to resonate the same and to thereby cause said device to act as an anode-tuned feedback oscillator, and means for applying a variable voltage to said second grid electrode to vary said input capacitance.

9. An oscillator comprising an electron discharge device having at least anode, cathode and first and second grid electrodes, means coupling said cathode electrode to a point of fixed reference potential through a path of low impedance, output connections coupled to said anode electrode, an inductor coupling said anode electrode to the positive terminal of a unidirectional potential source, a capacitor coupling said anode electrode to said first grid electrode to provide feedback from said anode electrode to said first grid electrode, said capacitor and the input capacitance of said device constituting a series circuit connected across said inductor to resonate the same and to thereby cause said device to act as an anode-tuned feedback oscillator, and means for applying a unidirectional control voltage to said second grid electrode to vary said input capacitance.

References Cited in the file of this patent

UNITED STATES PATENTS

| | | |
|---|---|---|
| 2,256,932 | Wolfskill | Sept. 23, 1941 |
| 2,506,762 | Antalek | May 9, 1950 |